US010775775B2

United States Patent
Iwata et al.

(10) Patent No.: US 10,775,775 B2
(45) Date of Patent: Sep. 15, 2020

(54) PREPARATION OPERATION DETERMINATION SYSTEM, METHOD, AND APPARATUS

(71) Applicant: Panasonic Intellectual Property Management Co., Ltd., Osaka (JP)

(72) Inventors: Isato Iwata, Fukuoka (JP); Takuya Yamazaki, Fukuoka (JP); Naofumi Ikuta, Fukuoka (JP); Hiroki Sagara, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 51 days.

(21) Appl. No.: 16/106,224

(22) Filed: Aug. 21, 2018

(65) Prior Publication Data
US 2019/0064784 A1 Feb. 28, 2019

(30) Foreign Application Priority Data
Aug. 30, 2017 (JP) .................................. 2017-164953

(51) Int. Cl.
*G05B 19/418* (2006.01)

(52) U.S. Cl.
CPC ... *G05B 19/41865* (2013.01); *G05B 19/4182* (2013.01); *G05B 19/4183* (2013.01); *G05B 19/41805* (2013.01)

(58) Field of Classification Search
CPC ............ G05B 19/4182; G05B 19/4183; G05B 19/41805; G05B 19/41865; G05B 2219/45029; H05K 13/08; H05K 13/085
See application file for complete search history.

(56) References Cited

U.S. PATENT DOCUMENTS

| | | | | |
|---|---|---|---|---|
| 6,879,866 | B2 * | 4/2005 | Tel | G05B 23/0283 700/100 |
| 7,120,511 | B1 * | 10/2006 | Tanzer | G06Q 10/06 700/100 |
| 7,212,876 | B2 * | 5/2007 | Blumenfeld | G05B 19/41865 700/99 |
| 8,798,778 | B2 * | 8/2014 | Schmidt | G05B 19/41835 700/100 |
| 9,798,947 | B2 * | 10/2017 | Norman | G06Q 10/06311 |

(Continued)

FOREIGN PATENT DOCUMENTS

JP     2002-237700     8/2002

*Primary Examiner* — M. N. Von Buhr
(74) *Attorney, Agent, or Firm* — Pearne & Gordon LLP

(57) ABSTRACT

A production system includes a production line for producing a product by connecting a plurality of production facilities having working units for doing work on a transported workpiece; a gap time calculator that calculates a plurality of gap times respectively corresponding to the plurality of the production facilities until a next workpiece is transported from an upstream production facility to each of the plurality of the production facilities based on a production status of each of the plurality of the production facilities; and a preparation operation determination unit that determines an automatic preparation operation capable of being executed in each of the plurality of the production facilities based on the plurality of the gap times. Each of the plurality of the production facilities executes the determined automatic preparation operation.

15 Claims, 10 Drawing Sheets

(56) References Cited

U.S. PATENT DOCUMENTS

| | | |
|---|---|---|
| 2002/0044432 A1 | 4/2002 | Nakano et al. |
| 2002/0103563 A1* | 8/2002 | Izawa .............. G05B 19/41875 700/121 |
| 2005/0257368 A1 | 11/2005 | Nakano et al. |
| 2005/0278049 A1* | 12/2005 | Van Den Nieuwelaar .................. G03F 7/70533 700/100 |
| 2009/0138114 A1* | 5/2009 | Burda .............. G05B 19/41865 700/101 |
| 2017/0004429 A1* | 1/2017 | Maenishi ......... G06Q 10/06312 |

\* cited by examiner

| PRODUCTION FACILITY | WORKING TIME | TRANSPORT TIME |
|---|---|---|
| BOARD SUPPLY APPARATUS | - | 5 SECONDS |
| PRINTING MACHINE | 10 SECONDS | 5 SECONDS |
| FIRST COMPONENT MOUNTING MACHINE | 30 SECONDS | 5 SECONDS |
| SECOND COMPONENT MOUNTING MACHINE | 30 SECONDS | 5 SECONDS |
| THIRD COMPONENT MOUNTING MACHINE | 30 SECONDS | 5 SECONDS |
| FOURTH COMPONENT MOUNTING MACHINE | 30 SECONDS | 5 SECONDS |
| FIFTH COMPONENT MOUNTING MACHINE | 30 SECONDS | 5 SECONDS |
| SIXTH COMPONENT MOUNTING MACHINE | 30 SECONDS | 5 SECONDS |
| SEVENTH COMPONENT MOUNTING MACHINE | 30 SECONDS | 5 SECONDS |
| EIGHTH COMPONENT MOUNTING MACHINE | 30 SECONDS | 5 SECONDS |
| NINTH COMPONENT MOUNTING MACHINE | 30 SECONDS | 5 SECONDS |
| REFLOW APPARATUS | - | 60 SECONDS |
| BOARD RECOVERY APPARATUS | - | - |

FIG. 7

| PRODUCTION FACILITY | PRODUCTION STATUS | GAP TIME |
|---|---|---|
| BOARD SUPPLY APPARATUS | CARRYING OUT IN PROGRESS | 0 SECOND |
| PRINTING MACHINE | CARRYING OUT IN PROGRESS | 0 SECOND |
| FIRST COMPONENT MOUNTING MACHINE | CARRYING IN PROGRESS | 0 SECOND |
| SECOND COMPONENT MOUNTING MACHINE | WAITING FOR CARRYING IN | 30 SECONDS |
| THIRD COMPONENT MOUNTING MACHINE | WAITING FOR CARRYING IN | 65 SECONDS |
| FOURTH COMPONENT MOUNTING MACHINE | WAITING FOR CARRYING IN | 100 SECONDS |
| FIFTH COMPONENT MOUNTING MACHINE | WAITING FOR CARRYING IN | 135 SECONDS |
| SIXTH COMPONENT MOUNTING MACHINE | WAITING FOR CARRYING IN | 170 SECONDS |
| SEVENTH COMPONENT MOUNTING MACHINE | WAITING FOR CARRYING IN | 205 SECONDS |
| EIGHTH COMPONENT MOUNTING MACHINE | PRODUCTION IN PROGRESS | 0 SECOND |
| NINTH COMPONENT MOUNTING MACHINE | CARRYING OUT IN PROGRESS | 0 SECOND |
| REFLOW APPARATUS | PRODUCTION IN PROGRESS | 0 SECOND |
| BOARD RECOVERY APPARATUS | CARRYING IN PROGRESS | 0 SECOND |

FIG. 8

| PRODUCTION FACILITY | AUTOMATIC PREPARATION OPERATION | PROCESSING TIME |
|---|---|---|
| PRINTING MACHINE | MASK CLEANING | 60 SECONDS |
| COMPONENT MOUNTING MACHINE | RECOGNITION TEACHING | 30 SECONDS |
| COMPONENT MOUNTING MACHINE | SUCTION POSITION TEACHING | 5 SECONDS |
| COMPONENT MOUNTING MACHINE | CORRECTION OF NOZZLE TIP | 60 SECONDS |
| COMPONENT MOUNTING MACHINE | CALIBRATION | 60 SECONDS |
| COMPONENT MOUNTING MACHINE | CORRECTION OF HEIGHT OF CARRIAGE | 60 SECONDS |
| COMPONENT MOUNTING MACHINE | MEASUREMENT OF SUCTION HEIGHT | 60 SECONDS |
| COMPONENT MOUNTING MACHINE | PRE-SUCTION TEST | 30 SECONDS |
| COMPONENT MOUNTING MACHINE | CORRECTION OF CHANGES OVER TIME | 30 SECONDS |
| COMPONENT MOUNTING MACHINE | HEAD MAINTENANCE | 60 SECONDS |
| COMPONENT MOUNTING MACHINE | TAPE CUT | 5 SECONDS |
| COMPONENT MOUNTING MACHINE | CLEANING OF NOZZLE BLOW | 30 SECONDS |
| COMPONENT MOUNTING MACHINE | LOAD CHECK | 30 SECONDS |
| COMPONENT MOUNTING MACHINE | LCR CONSTANT CHECK | 60 SECONDS |
| REFLOW APPARATUS | POWER SAVING | - |

FIG. 9

| SEVENTH COMPONENT MOUNTING MACHINE | | |
|---|---|---|
| AUTOMATIC PREPARATION OPERATION | PROCESSING TIME | PRIORITY |
| CORRECTION OF CHANGES OVER TIME | 30 SECONDS | 1 |
| SUCTION POSITION TEACHING | 5 SECONDS | 2 |
| HEAD MAINTENANCE (NP7) | 60 SECONDS | 3 |
| HEAD MAINTENANCE (NP8) | 60 SECONDS | 4 |
| CLEANING OF NOZZLE BLOW | 30 SECONDS | 5 |
| HEAD MAINTENANCE (NP1) | 60 SECONDS | 6 |
| HEAD MAINTENANCE (NP2) | 60 SECONDS | 7 |
| HEAD MAINTENANCE (NP3) | 60 SECONDS | 8 |
| HEAD MAINTENANCE (NP4) | 60 SECONDS | 9 |
| HEAD MAINTENANCE (NP5) | 60 SECONDS | 10 |
| HEAD MAINTENANCE (NP6) | 60 SECONDS | 11 |
| TAPE CUT | 5 SECONDS | 12 |
| RECOGNITION TEACHING | 30 SECONDS | 13 |
| ... | ... | ... |

PREPARATION OPERATION DETERMINATION SYSTEM, METHOD, AND APPARATUS

BACKGROUND

1. Technical Field

The present disclosure relates to a production system including a production line for producing a product, a production method, and a production line management apparatus in the production system.

2. Description of the Related Art

A product such as a mounting board produced by mounting a component on a board which is a workpiece is produced by doing work while transporting workpieces in order in a production line in which a plurality of production facilities such as a printing machine, a component mounting machine, and a reflow machine are connected. The production facility is provided with an automatic preparation operation function for temporarily stopping production work and executing an automatic preparation operation such as calibration for maintaining production precision (for example, Japanese Patent Unexamined Publication No. 2002-237700). In the component mounting machine disclosed in Japanese Patent Unexamined Publication No. 2002-237700, the calibration is automatically executed when a preset predetermined time has elapsed.

SUMMARY

According to the disclosure, there is provided a production system including a production line for producing a product by connecting a plurality of production facilities having working units for doing work on a transported workpiece; a gap time calculator that calculates a plurality of gap times respectively corresponding to the plurality of the production facilities until a next workpiece is transported from an upstream production facility to each of the plurality of the production facilities based on a production status of each of the plurality of the production facilities; and a preparation operation determination unit that determines an automatic preparation operation capable of being executed in each of the plurality of the production facilities based on the plurality of the gap times. Each of the plurality of the production facilities executes the determined automatic preparation operation.

According to the disclosure, there is provided a production method in a production system including a production line for producing a product by connecting a plurality of production facilities having working units for doing work on a transported workpiece, the method including a working step of doing work on the transported workpiece in each of the plurality of the production facilities; a production status acquisition step of acquiring a production status of each of the plurality of the production facilities; a gap time calculation step of calculating a plurality of gap times respectively corresponding to the plurality of the production facilities until a next workpiece is transported from an upstream production facility to each of the plurality of the production facilities based on the production status of each of the plurality of the production facilities; a preparation operation determination step of determining an automatic preparation operation capable of being executed in each of the plurality of the production facilities based on the plurality of the gap times; and an automatic preparation operation step of executing the determined automatic preparation operation in each of the plurality of the production facilities. The working step is executed in a production facility of the plurality of the production facilities, to which a workpiece is transported, and the automatic preparation operation step is executed in a production facility of the plurality of the production facilities, in which the automatic preparation operation is capable of being executed.

According to the disclosure, there is provided a production line management apparatus that manages a production line for producing a product by connecting a plurality of the production facilities having working units for doing work on a transported workpiece, the apparatus including a production status acquiring unit that acquires a production status of each of the plurality of the production facilities; a gap time calculator that calculates a plurality of gap times respectively corresponding to the plurality of the production facilities until a next workpiece is transported from an upstream production facility to each of the plurality of the production facilities based on the production status of each of the plurality of the production facilities; a preparation operation determination unit that determines an automatic preparation operation capable of being executed in each of the plurality of the production facilities based on the plurality of the gap times; and a preparation operation instructing unit that instructs the executable automatic preparation operation to each of the plurality of the production facilities.

According to the disclosure, it is possible to maintain production precision without lowering productivity.

BRIEF DESCRIPTION OF THE DRAWINGS

FIG. 5 is an explanatory view of a working time of a production facility included in a component mounting line of an embodiment of the disclosure;

FIG. 7 is an explanatory view illustrating an example of the production status and a gap time of the component mounting line of an embodiment of the disclosure;

FIG. 8 is an explanatory view illustrating an automatic preparation operation and a processing time of the production facility included in the component mounting line of an embodiment of the disclosure;

FIG. 9 is an explanatory view illustrating an example of a priority table used in the component mounting system of an embodiment of the disclosure.

DETAILED DESCRIPTIONS

In the technique disclosed in Japanese Patent Unexamined Publication No. 2002-237700, there is a problem that the productivity lowers because the calibration is executed by temporarily stopping the production work. An object of the disclosure is to provide a production system, a production method, and a production line management apparatus that can maintain production accuracy without lowering productivity.

Figure 2:
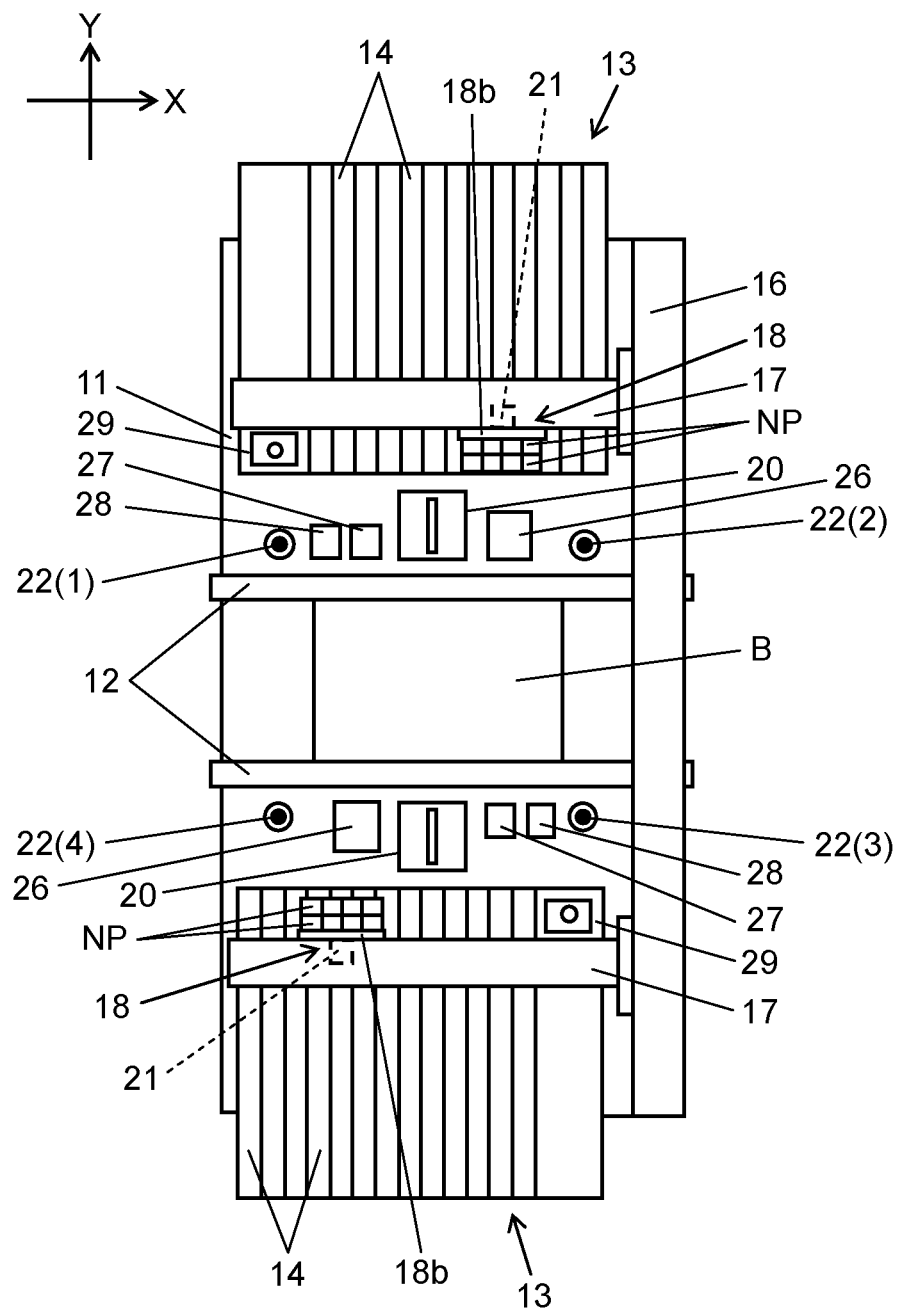
FIG. 2 is a plan view of a component mounting machine of an embodiment of the disclosure.
Figure 3:
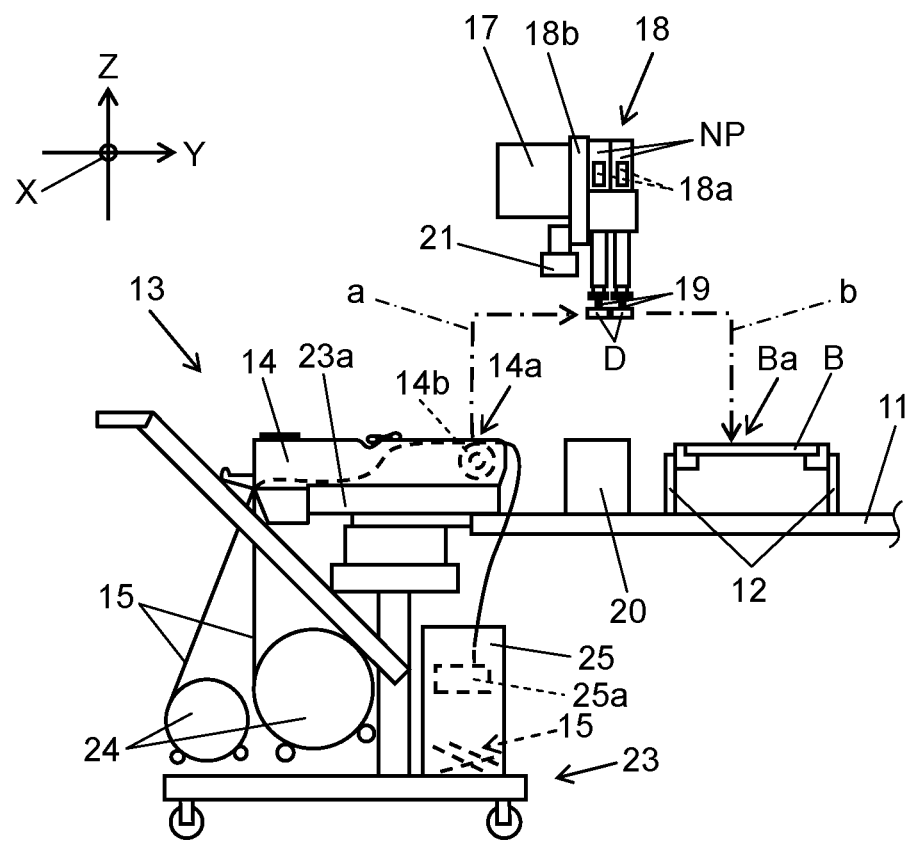
FIG. 3 is an explanatory view of a configuration of the component mounting machine of an embodiment of the disclosure.

An embodiment of the disclosure will be described in detail with reference to the drawings. A configuration, a shape, and the like described below are examples for explanation, and can be appropriately changed in accordance with the specifications of a component mounting system, a component mounting line, and a production facility. In the following description, the same reference numerals are given to corresponding elements in all drawings and redundant explanations will be omitted. In FIG. 2 and in a part to be described later, as two axial directions orthogonal to each other in a horizontal plane, an X direction (rightward and leftward direction in FIG. 2) indicates a board transport direction and a Y direction (upward and downward direction in FIG. 2) indicates a direction orthogonal to the board transport direction. In FIG. 3, a Z direction (upward and downward direction in FIG. 3) indicates a height direction orthogonal to the horizontal plane. The Z direction is the upward and downward direction, that is, an orthogonal direction in a case where the component mounting machine is disposed on a horizontal plane.

First, a configuration of component mounting system 1 will be described with reference to FIG. 1. Component mounting system 1 includes board supply apparatus 2, printing machine 3, first component mounting machine M1, second component mounting machine M2, third component mounting machine M3, fourth component mounting machine M4, fifth component mounting machine M5, sixth component mounting machine M6, seventh component mounting machine M7, eighth component mounting machine M8, ninth component mounting machine M9, reflow apparatus 4, and board recovery apparatus 5 which are production facilities sequentially from an upper side (left side in FIG. 1) in an upstream side in the board transport direction.

Each production facility includes a board transporting apparatus having a belt conveyor and a working unit doing work on a transported board (workpiece). A board transporting apparatus of a production facility of a most upstream side is connected to a board transporting apparatus of a production facility of a downstream side. The board transporting apparatus of the production facility of a most downstream side is connected to the board transporting apparatus of the production facility of the upstream side. The board transporting apparatus of each intermediate production facility except the most upstream side and downstream side production facilities is connected to the board transporting apparatus of the upstream side and downstream side production facilities. Each of the production facilities forms component mounting line 6 (production line) for producing a mounting board (product) while transporting the board from the upstream side to the downstream side with the board transporting apparatus.

Hereinafter, in a case where first component mounting machine M1, second component mounting machine M2, third component mounting machine M3, fourth component mounting machine M4, fifth component mounting machine M5, sixth component mounting machine M6, seventh component mounting machine M7 eighth component mounting machine M8, and ninth component mounting machine M9 are not necessary to distinguish, it is abbreviated as component mounting machines M1 to M9.

Figure 4:
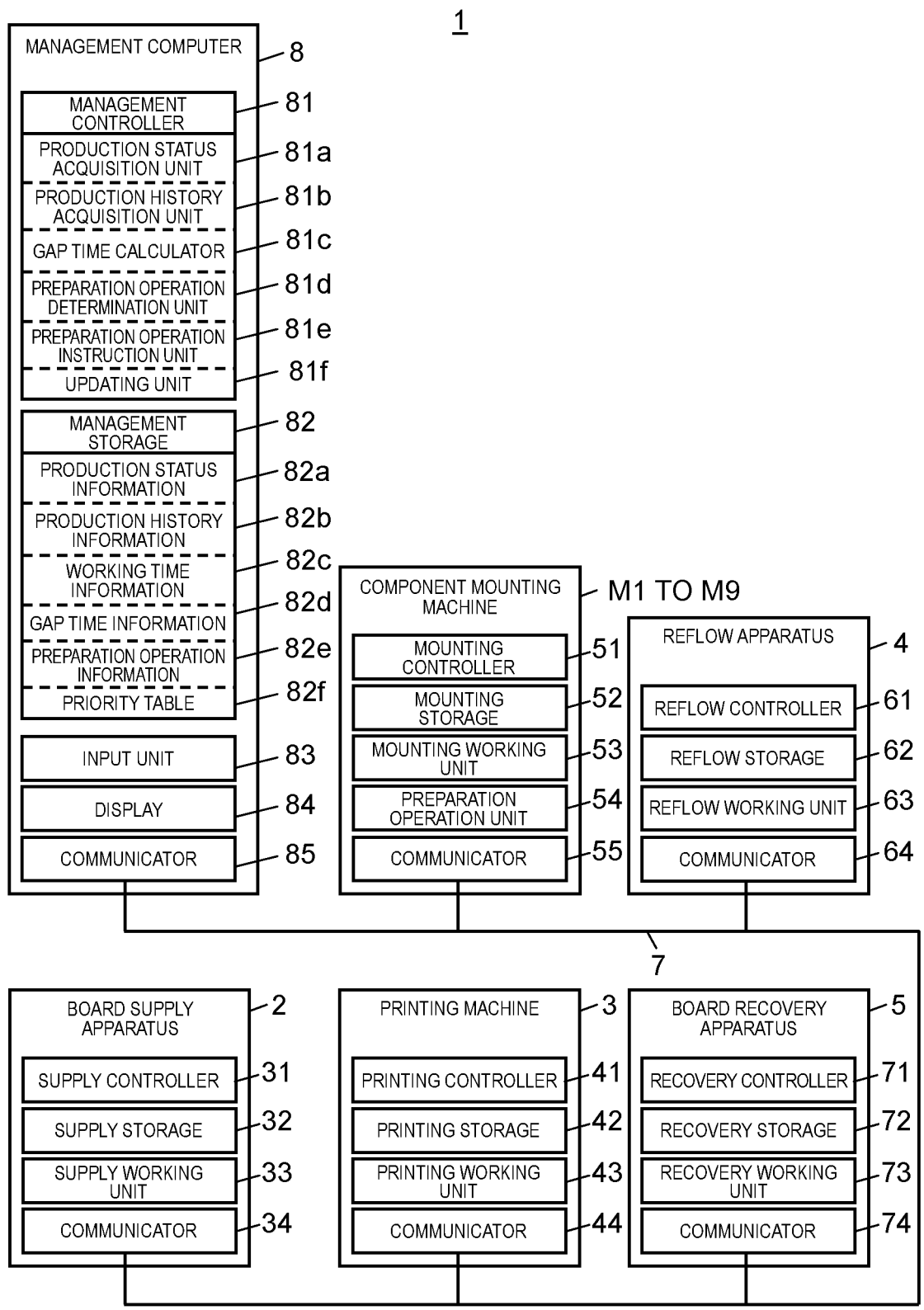
FIG. 4 is a block diagram of a configuration of a control system of a component mounting system of an embodiment of the disclosure.

In FIG. 4, board supply apparatus 2, printing machine 3, component mounting machines M1 to M9, reflow apparatus 4, and board recovery apparatus 5 respectively include communicators 34, 44, 55, 64, and 74. Each of communicators 34, 44, 55, 64, and 74 is connected to communicator 85 included in management computer 8 by wired or wireless communication network 7 and can perform exchange of data with management computer 8. Management computer 8 receives the production status and the production history of each apparatus of component mounting line 6 and integrates manufacturing of the mounting board in component mounting line 6.

A configuration of each apparatus configuring component mounting line 6 will be described with reference to FIGS. 1 and 4. Board supply apparatus 2 has a function of supplying the board to a downstream apparatus by picking up the board from a rack by controlling supply working unit 33 (working unit) including the rack for storing a plurality of boards by supply controller 31 based on board supply data stored in supply storage 32.

Printing machine 3 has a function of executing printing work for applying (printing) paste-like cream solder to the board via a metal mask by controlling printing working unit 43 (working unit) by printing controller 41 based on solder printing data stored in printing storage 42. Printing working unit 43 includes a cleaning unit (not illustrated) which executes mask cleaning for removing the cream solder adhering to a lower surface of the metal mask. Printing machine 3 executes the mask cleaning every time the cream solder is applied to a predetermined number of the boards and executes the mask cleaning in accordance with a preparation operation instruction transmitted from management computer 8 which is described later. The apparatus is not limited to printing machine 3 as long as it is an apparatus that applies the cream solder to the board, and for example, may be a cream soldering machine.

Figure 1:
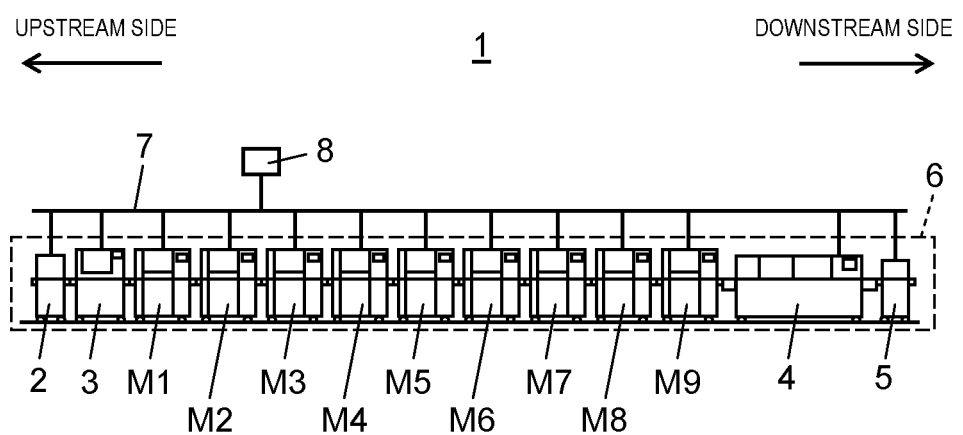
FIG. 1 is an explanatory view of a configuration of a component mounting system of an embodiment of the disclosure.

In FIGS. 1 and 4, reflow apparatus 4 has a function of executing reflow work for soldering the component by solidifying the cream solder after melting the cream solder by heating the board on which the component is placed by controlling reflow working unit 63 (working unit) by reflow controller 61 based on reflow data stored in reflow storage 62. Reflow apparatus 4 has a production mode for executing the reflow work and a power saving mode for controlling electric power of a heater until the board of a working target is loaded. Reflow apparatus 4 switches an operation mode to the production mode or the power saving mode in accordance with the preparation operation instruction transmitted from management computer 8.

Board recovery apparatus 5 has a function of recovering the mounting board on which the component is soldered to store the mounting board on the rack by controlling recovery working unit 73 (working unit) including the rack in which a plurality of the boards are stored by recovery controller 71 based on board recovery data stored in recovery storage 72.

Next, configurations of component mounting machines M1 to M9 will be described with reference to FIGS. 2 and 3. Component mounting machines M1 to M9 have a function of placing the component on the board to which the cream solder is applied. Board transport mechanism 12 is disposed at a center on an upper surface of base 11 in the X direction. Board transport mechanism 12 transports board B delivered from the upstream production facility and positions and holds board B at a mounting working position by a component mounting mechanism which is described later.

Board transport mechanism 12 carries board B on which the component mounting work is completed to the downstream production facility.

Component suppliers 13 are disposed on both sides of board transport mechanism 12 and a plurality of tape feeders 14 are juxtaposed in component supplier 13. Tape feeder 14 pitch-feeds carrier tape 15, which holds component D of the mounting target, so that component D is supplied to component suction position 14a by the component mounting mechanism.

In FIGS. 2 and 3, Y-axis beam 16 including a linear drive mechanism is disposed in the Y direction at an end portion on one side in the X direction on the upper surface of base 11. Similarly, two X-axis beams 17 including a linear drive mechanism are coupled to Y-axis beam 16 to be movable in the Y direction. Mounting head 18 is installed in each of two X-axis beams 17 to be movable in the X direction. Mounting head 18 includes a plurality of holding heads NP (here, eight holding heads NP1 to NP8) and suction nozzles 19 capable of sucking and holding component D, and individually moving up and down is installed at lower end portions of respective holding heads NP.

Each holding head NP includes flow rate sensor 18a that measures a flow rate of air flowing in through an opening at a lower end of suction nozzle 19. A suction error, in which component D is not sucked by suction nozzle 19 or is not sucked in a correct posture, is detected by a measurement result of flow rate sensor 18a. Holding head NP is moved above component D supplied to component suction position 14a of tape feeder 14 and the flow rate of the air is measured by flow rate sensor 18a while lowering suction nozzle 19, so that it is possible to measure a suction height at which the opening of suction nozzle 19 abuts against the upper surface of component D.

The measured suction height is used for correcting a descent amount when suction nozzle 19 descends. The measurement of the suction height is executed when component D is exchanged, when component D is replenished, and when suction nozzle 19 is exchanged, and is executed in accordance with the preparation operation instruction transmitted from management computer 8. Each holding head NP spouts a compressed air supplied from a compressed air supplier (not illustrated) from the opening of suction nozzle 19 and can execute nozzle blow cleaning for removing dust or the like adhering to the opening of suction nozzle 19. Holding head NP executes the nozzle blow cleaning in accordance with the preparation operation instruction transmitted from management computer 8.

In FIGS. 2 and 3, mounting head 18 moves in the X direction and the Y direction by driving Y-axis beam 16 and X-axis beam 17. Therefore, two mounting heads 18 suck and hold components D by suction nozzles 19 from component suction positions 14a of tape feeders 14 disposed in corresponding component suppliers 13 respectively. Mounting head 18 picks up (arrow a) held component D and mounts (arrow b) component D on mounting point Ba of board B positioned in board transport mechanism 12.

Component recognition camera 20 is disposed between component supplier 13 and board transport mechanism 12. When mounting head 18, which picks up component D from component supplier 13, moves above component recognition camera 20, component recognition camera 20 images and recognizes component D held by mounting head 18. Board recognition cameras 21, which position on a lower surface side of X-axis beams 17 and respectively move integrally with mounting head 18, are installed in coupling plate 18b to which mounting head 18 is attached. Mounting head 18 moves, so that board recognition camera 21 moves above board B which is positioned in board transport mechanism 12, images a board mark (not illustrated) provided in board B, and recognizes the position of board B.

In a mounting operation of component D on board B by mounting head 18, mounting position correction is performed taking into consideration a recognition result of component D by component recognition camera 20 and a board recognition result by board recognition camera 21. As described above, Y-axis beam 16, X-axis beams 17, mounting head 18, component recognition camera 20, and board recognition cameras 21 configure mounting working unit 53 (see FIG. 4) that is a working unit for moving and mounting component D to and on board B by moving mounting head 18 which holds component D.

Board B is a workpiece, the mounting board in which component D is mounted on board B via a solder is a product. Printing machine 3, component mounting machines M1 to M9, and reflow apparatus 4 are production facilities having the working units (printing working unit 43, mounting working unit 53, and reflow working unit 63) which do work on the transported workpiece. Component mounting line 6 including printing machine 3, component mounting machines M1 to M9, and reflow apparatus 4 is a production line for producing a product by connecting a plurality of the production facilities. In FIGS. 2 and 3, in the mounting operation, a recognition error in which component D sucked by suction nozzle 19 is not recognized is detected by the recognition result of component D by component recognition camera 20. In a case where the recognition error frequently occurs, recognition teaching for adjusting a recognition region of component recognition camera 20, setting of the camera, and the like when component D is recognized is executed. The recognition teaching is executed in accordance with the preparation operation instruction transmitted from management computer 8 after component D is exchanged, in a case where an occurrence frequency of the recognition error exceeds a predetermined value, or the like.

Nozzle tip correction is performed to calculate a correction value for correcting a positional deviation of the opening of suction nozzle 19 from a predetermined position from a recognition result of suction nozzle 19 which does not suck component D by component recognition camera 20. The nozzle tip correction is executed in accordance with the preparation operation instruction transmitted from management computer 8 in a case where the positional deviation is large when component D is mounted on board B, after suction nozzle 19 is exchanged, or the like.

In the calibration for measuring and correcting an original point in the apparatus in the mounting operation, a center of rotation is recognized and a correction value is calculated while rotating suction nozzle 19 which does not suck component D above component recognition camera 20. The calibration is executed in accordance with the preparation operation instruction transmitted from management computer 8 after mounting head 18 and suction nozzle 19 are exchanged, or the like.

In a case where the suction error frequently occurs, suction position teaching for calculating the correction value of the suction position of component D is performed from the recognition result of component D of component suction position 14a which is imaged by moving board recognition camera 21 above tape feeder 14 supplying component D. The suction position teaching is executed in accordance with the preparation operation instruction transmitted from management computer 8 after component D is exchanged, in a state where the occurrence frequency of the suction error exceeds a predetermined value, or the like.

When component D is exchanged, or the like, a pre-suction test is executed to check stored information by detecting a character printed on the upper surface of component D, a direction of component D, or the like from the recognition result of component D supplied to component suction position 14a which is imaged by board recognition camera 21. The pre-suction test is executed in accordance with the preparation operation instruction transmitted from management computer 8 after component D is exchanged, or the like.

In FIG. 2, four position reference posts 22 for detecting changes over time are provided in an arrangement that surrounds board B which is positioned in board transport mechanism 12 on the upper surface of base 11. In position reference posts 22, the numbers (1) to (4) are given and in the clockwise direction so that they can individually be specified. The positions of position reference posts 22(1) to 22(4) are recognized by board recognition camera 21, so that changes over time, in which mounting head 18 is displaced from a normal state due to thermal deformation of Y-axis beam 16, X-axis beams 17, or the like, are detected.

A correction value for mounting component D on mounting point Ba of board B which is positioned in board transport mechanism 12 is calculated from the detected changes over time. The correction of the changes over time for calculating the correction value by the changes over time is executed in accordance with the preparation operation instruction transmitted from management computer 8 when the mounting work exceeds a predetermined duration time, a predetermined number of mounting components, or the like.

In FIG. 3, carriage 23 is coupled to component supplier 13. The plurality of tape feeders 14 are fitted to feeder base 23a on an upper portion of carriage 23 side by side in the X direction. Reel 24 for winding and housing carrier tape 15 is held by carriage 23. Carrier tape 15 into which tape feeder 14 is inserted is pitch-fed by tape feed mechanism 14b at constant intervals which is built in tape feeder 14, and components D housed in carrier tape 15 are sequentially supplied to component suction position 14a.

Empty carrier tape 15, from which component D is picked up and is discharged from tape feeder 14, is taken into tape recovery apparatus 25 provided in carriage 23. Tape recovery apparatus 25 includes tape cutter 25a and cuts and recovers empty carrier tape 15. The tape cut for cutting empty carrier tape 15 is executed in accordance with the preparation operation instruction transmitted from management computer 8 in a case where taken empty carrier tape 15 reaches a predetermined length, or the like.

A height measuring unit (not illustrated) for measuring a height of the carriage is provided in carriage 23. Mounting head 18 is moved above the height measuring unit and the flow rate of the air is measured by flow rate sensor 18a while descending suction nozzle 19, so that the height of the carriage can be measured. A correction value of the height of the carriage is calculated by the measured height of the carriage and is used for correcting the descent amount when suction nozzle 19 is descended. The correction of the height of the carriage is executed when carriage 23 is coupled to component supplier 13 and is executed in accordance with the preparation operation instruction transmitted from management computer 8.

In FIG. 2, component disposal unit 26, load measuring unit 27, inductance (L), capacitance (C), and resistance (R) measuring unit 28, or LCR measuring unit 28, are disposed between component supplier 13 and board transport mechanism 12. Component D which is not mounted on board B as a result of detection of the suction error or the recognition error, component D which is used in the recognition teaching, or the like is discarded in component disposal unit 26. Load measuring unit 27 measures a load applied to suction nozzle 19 by descending suction nozzle 19. The descent amount of suction nozzle 19 in the mounting operation is corrected by the measurement result. The load check is executed in accordance with the preparation operation instruction transmitted from management computer 8 after suction nozzle 19 is exchanged, the mounting operation of a predetermined amount is executed, or the like.

LCR measuring unit 28 measures an inductance value, a capacitance value, a resistance value, or the like of component D held by suction nozzle 19. A mistake or a fault of supplied component D is detected by checking the measurement result with a value included in mounting data. LCR constant check is executed in accordance with the preparation operation instruction transmitted from management computer 8 after component D supplied by tape feeder 14 is exchanged and replenished, or the like.

In FIG. 2, head maintenance unit 29 is mounted on a part of component supplier 13. Head maintenance unit 29 has a function of automatically executing head maintenance such as inspection and cleaning of shafts included in holding heads NP1 to NP8. In the head maintenance, holding heads NP1 to NP8 are sequentially accessed to head maintenance unit 29. The head maintenance is executed in accordance with the preparation operation instruction transmitted from management computer 8 after mounting head 18 is exchanged, after the mounting operation of a predetermined amount is executed, or the like.

As described above, flow rate sensor 18a, holding heads NP1 to NP8, component recognition camera 20, board recognition camera 21, tape cutter 25a, load measuring unit 27, LCR measuring unit 28, and head maintenance unit 29 configure preparation operation unit 54 (see FIG. 4) executing the automatic preparation operations such as the measurement of the suction height, the correction of the height of the carriage, cleaning of nozzle blow, the recognition teaching, the correction of the nozzle tip, the calibration, the suction position teaching, the pre-suction test, the correction of the changes over time, the tape cut, the load check, the LCR constant check, and the head maintenance.

Next, a configuration of a control system of component mounting system 1 will be described with reference to FIG. 4. Component mounting machines M1 to M9 execute the mounting operation by controlling mounting working unit 53 by mounting controller 51 based on the mounting data stored in mounting storage 52. In addition, component mounting machines M1 to M9 execute the automatic preparation operation at a predetermined timing by controlling preparation operation unit 54 by mounting controller 51 based on correction operation data stored in mounting storage 52. Component mounting machines M1 to M9 execute the automatic preparation operation by controlling preparation operation unit 54 by mounting controller 51 in accordance with the preparation operation instruction transmitted from management computer 8.

Management computer 8 includes management controller 81, management storage 82, input unit 83, display 84, and communicator 85. Input unit 83 is an input device such as a keyboard, a touch panel, or a mouse, and is used at the time of inputting an operation command and data, and the like. Display 84 is a displayed device such as a liquid crystal panel and displays various information stored in management storage 82. Management controller 81 is an arithmetic processing device including a CPU and a memory. The CPU executes a program stored in the memory so that various internal processing functions are realized. In the embodiment, as the internal processing functions, production status acquisition unit 81*a*, production history acquisition unit 81*b*, gap time calculator 81*c*, preparation operation determination unit 81*d*, preparation operation instruction unit 81*e*, and updating unit 81*f* are provided. Management storage 82 is a storage device and stores production status information 82*a*, production history information 82*b*, working time information 82*c*, gap time information 82*d*, preparation operation information 82*e*, priority table 82*f*, and the like.

In FIG. 4, production status acquisition unit 81*a* acquires the production status of each production facility at a predetermined timing from each production facility configuring component mounting line 6 (production line). As the production status, there are "production in progress" in which production work is executed in board B (workpiece) which is transported by the working unit of each production facility, "carrying in progress" in which board B is carried in the working unit, "carrying out in progress" in which board B is carried out from the working unit, "waiting for carrying in" waiting for board B to be carried in from the upstream production facility, "waiting for carrying out" waiting for board B to be carried out to the downstream production facility, "stop" in which the production work is stopped due to a work error or waiting for member replenishment, and the like. The acquired production status is stored in management storage 82 as production status information 82*a*.

Production history acquisition unit 81*b* acquires the production history of each production facility at a predetermined timing from each production facility configuring component mounting line 6. As the production history, there are the number of times of the production work, a continuous working time, and a cumulative working time executed by the working unit, an elapsed time from a previous automatic preparation operation executed by the production facility, and the like. The acquired production history is stored in management storage 82 as production history information 82*b*. In working time information 82*c*, the working time and the transport time for each board B executed in each production facility are included for each type of the mounting board to be produced.

Here, an example of working time information 82*c* will be described with reference to FIG. 5. Since there is no processing work on board B, board supply apparatus 2 has the working time of 0 second, and the transport time for picking up board B from the rack and carrying out board B to downstream printing machine 3 is 5 seconds. Printing machine 3 has the working time for the printing work with respect to board B of 10 seconds, and the transport time for carrying out board B to downstream first component mounting machine M1 after printing is 5 seconds. Component mounting machines M1 to M9 have the working time for the mounting work with respect to board B of 30 seconds, and the transport time for carrying out board B to the downstream production facility after mounting is 5 seconds.

Reflow apparatus 4 executes the reflow work while transporting board B to the downstream side in reflow working unit 63. Therefore, for the sake of convenience, the working time is 0 second and a sum of the time of the reflow work and the time for transporting board B, on which component D is soldered, to downstream board recovery apparatus 5 is 60 seconds as the transport time. Board recovery apparatus 5 has the working time for the processing work with respect to board B of 0 second, and a time for recovering board B, on which component D is soldered, to the rack is included in the time for carrying out board B by reflow apparatus 4. Therefore, for the sake of convenience, the transport time is 0 second.

In FIG. 4, gap time calculator 81*c* calculates a gap time until next board B (workpiece) is transported from the upstream production facility to each production facility based on the production status included in production status information 82*a* and the working time and the transport time included in working time information 82*c*. That is, the gap time is a time from the present time to a time when next board B is received. The present time means a time when the gap time is calculated. Gap time calculator 81*c* calculates the gap time at a predetermined timing such as when the production status is updated. The calculated gap time is stored in management storage 82 as gap time information 82*d*.

Figure 6:
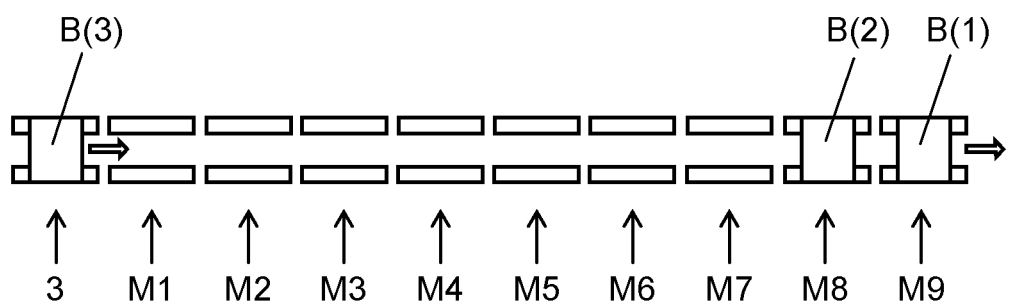
FIG. 6 is an explanatory view illustrating an example of a production status of the component mounting line of an embodiment of the disclosure.

Here, an example of the production status and the calculated gap time of component mounting line 6 will be described with reference to FIGS. 6 and 7. FIG. 6 schematically illustrates the production status of printing machine 3 and component mounting machines M1 to M9 of component mounting line 6. In FIGS. 6 and 7, the production status of printing machine 3 is in "carrying out in progress" and board B(3) after printing is carried out to downstream first component mounting machine M1. The production status of first component mounting machine M1 is in "carrying in progress" and board B(3) is carried in. The production status of board supply apparatus 2 is in "carrying out in progress" and next board B(4) (not illustrated) is carried out to printing machine 3. As described above, the gap time of board supply apparatus 2, printing machine 3, and first component mounting machine M1 in the transport of board B is 0 second.

The production status of second component mounting machine M2 is "waiting for carrying in" and waits for carrying in of next board B(3). Since the production status of upstream first component mounting machine M1 is "carrying in progress", next board B(3) is not carried in at least for the working time (30 seconds) of first component mounting machine M1. Therefore, gap time calculator 81*c* calculates the gap time of second component mounting machine M2 as 30 seconds. The production status of third component mounting machine M3 is "waiting for carrying in" and next board B(3) is waiting for carrying in. Therefore, gap time calculator 81*c* calculates the gap time of third component mounting machine M3 as 65 seconds obtained by adding the working time (30 seconds) and the transport time (5 seconds) of second component mounting machine M2 to the gap time (30 seconds) of upstream second component mounting machine M2.

In FIGS. 6 and 7, the production status from fourth component mounting machine M4 to seventh component mounting machine M7 is in "waiting for carrying in" and next board B(3) is waiting for carrying in. Similarly, gap time calculator 81*c* calculates the gap time of fourth component mounting machine M4 as 100 seconds, that of fifth component mounting machine M5 as 135 seconds, that of sixth component mounting machine M6 as 170 seconds, and that of seventh component mounting machine M7 as 205 seconds.

The production status of eighth component mounting machine M8 is in "production in progress" and the component mounting work is performed to board B(2). The production status of ninth component mounting machine M9 is in "carrying out in progress" and board B(1) after the component is mounted is carried out to downstream reflow apparatus 4. The production status of reflow apparatus 4 is in "production in progress" and the reflow work is executed. The production status of board recovery apparatus 5 is in "carrying in progress" and board B is transported from upstream reflow apparatus 4. As described above, the gap time of eighth component mounting machine M8, ninth component mounting machine M9, reflow apparatus 4, and board recovery apparatus 5 in the production work or in the transport of board B is 0 second.

In FIG. 4, a processing time of the automatic preparation operation executed by each production facility is stored in preparation operation information 82e in association with items of the production facility and the automatic preparation operation. The priority of the automatic preparation operation executed in the gap time is stored in priority table 82f corresponding to each production facility. FIG. 8 illustrates an example of the automatic preparation operation and the processing time included in preparation operation information 82e in printing machine 3, component mounting machines M1 to M9, and reflow apparatus 4. FIG. 9 illustrates an example of priority table 82f of seventh component mounting machine M7. Priority table 82f displays the automatic preparation operation in accordance with the priority.

In FIG. 4, preparation operation determination unit 81d determines the automatic preparation operation capable of executing in each production facility based on the gap time included in gap time information 82d and the priority included in priority table 82f. Executable means that the processing time (in a case of a plurality of the automatic preparation operations, a sum of the processing times of respective automatic preparation operations) of the automatic preparation operation is equal to or shorter than the gap time. The automatic preparation operation determined by preparation operation determination unit 81d is hatching with diagonal lines in priority table 82f illustrated in FIG. 9 based on the gap time (205 seconds) of seventh component mounting machine M7 illustrated in FIG. 7 and the priority included in priority table 82f illustrated in FIG. 9. That is, preparation operation determination unit 81d selects the automatic preparation operation capable of executing in the gap time of 205 seconds in descending order of the priority from priority table 82f. Preparation operation determination unit 81d may select the automatic preparation operation capable of executing in the gap time regardless of the priority. For example, management storage 82 saves a table including the processing time of each of the plurality of the automatic preparation operations instead of priority table 82f. Preparation operation determination unit 81d compares the gap time with the processing time of each automatic preparation operation and selects an automatic preparation operation having the processing time that falls within the gap time. In this case, preparation operation determination unit 81d may select, for example, an automatic preparation operation having a longest processing time in the gap time.

More specifically, the correction of the changes over time, the suction position teaching, the head maintenance (NP7), the head maintenance (NP8), the cleaning of the nozzle blow in the highest priority (1 to 5) are selected as the executable automatic preparation operation. The tape cut of which the priority is 12 is selected as the executable automatic preparation operation in a remaining gap time (20 seconds) obtained by subtracting a sum (185 seconds) of the processing time of the 5 items from the gap time (205 seconds).

In FIG. 4, preparation operation instruction unit 81e instructs each production facility the executable automatic preparation operation. In the example illustrated in FIG. 9, preparation operation instruction unit 81e transmits a command (preparation operation instruction) for executing the automatic preparation operation which is determined by preparation operation determination unit 81d and is hatched to seventh component mounting machine M7. Seventh component mounting machine M7 executes the automatic preparation operation in accordance with the preparation operation instruction transmitted from preparation operation instruction unit 81e. The instructed automatic preparation operation is executed within the gap time.

Updating unit 81f updates priority table 82f when the automatic preparation operation is executed in the production facility and a completion report of the automatic preparation operation transmitted by the production facility is received. In a case where the completion report of the automatic preparation operation by the production facility is not transmitted, updating unit 81f updates priority table 82f based on an instruction content of preparation operation instruction unit 81e. For example, in the example illustrated in FIG. 9, when the head maintenance (NP7) and the head maintenance (NP8) are executed, the priority of the head maintenance (NP7) and the head maintenance (NP8) is updated by updating unit 81f to be lower than that of the head maintenance (NP6).

Updating unit 81f updates the priority of priority table 82f based on the production history included in production history information 82b. For example, updating unit 81f increases the priority of the recognition teaching of suction nozzle 19 in which the recognition error exceeds a predetermined frequency, and increases the priority of the suction position teaching of component D in which the suction error exceeds a predetermined frequency, the correction of the nozzle tip of suction nozzle 19 which sucks component D, and the head maintenance of holding head NP on which suction nozzle 19 is mounted.

Next, a production method of the mounting board (product) in component mounting system 1 (production system) will be described with reference to a flow of FIG. 10. First, priority table 82f including the priority of the automatic preparation operation is stored in management storage 82 (storage unit) of management computer 8 (ST1: a storage step). Next, in each production facility included in component mounting line 6, it is determined whether or not board B of the working target is carried in (ST2: a board carrying in determination step). In the production facility in which board B is carried (Yes in step ST2), the production work is executed in carried-in board B (ST3: a working step). In the production facility in which work is completed, the procedure returns to the board carrying in determination step (ST2) and next board B is determined to be carried in. That is, in the working step (ST3), work is carried out on transported board B (workpiece) in each production facility.

In a case where board B is not carried in (No in step ST2), in management computer 8, production status acquisition unit 81a acquires the production status of each production facility (ST4: a production status acquisition step), and production history acquisition unit 81b acquires the production history of the production facility (ST5: a production history acquisition step). Next, gap time calculator 81c calculates a gap time until next board B (workpiece) is transported from the upstream production facility to each production facility based on the production status, the working time, and the transport time (ST6: a gap time calculation step). Next, preparation operation determination unit 81d determines the automatic preparation operation capable of executing in each production facility based on the gap time and the priority included in stored priority table 82f (ST7: a preparation operation determination step).

Figure 10:
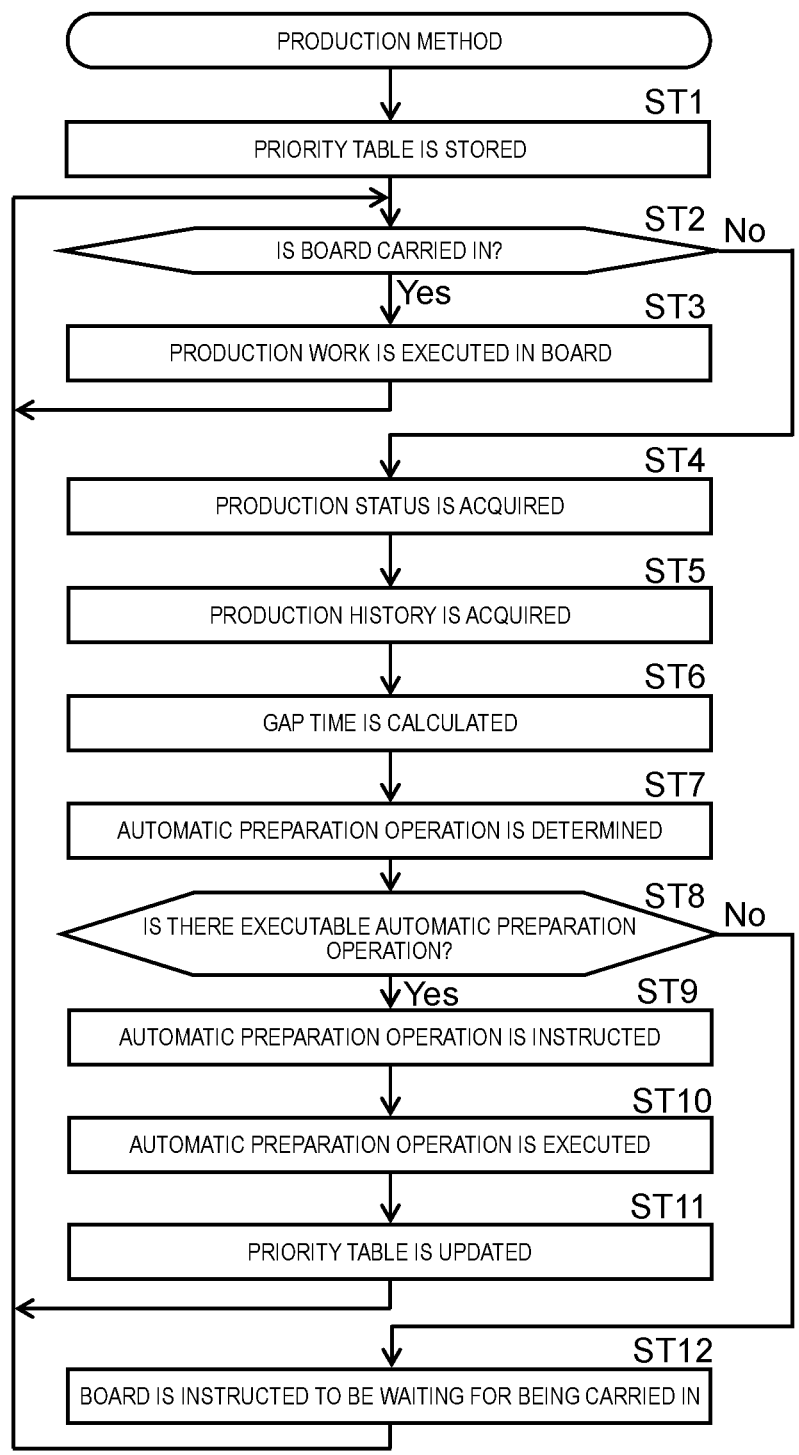
FIG. 10 is a flowchart illustrating a flow of a production method in the component mounting system of an embodiment of the disclosure.

In FIG. 10, next, in a case where there is the automatic preparation operation capable of executing in the production facility (Yes in step ST8), preparation operation instruction unit 81e instructs the production facility to execute the automatic preparation operation (ST9: an automatic preparation operation executing instruction step) determined in the preparation operation determination step (ST7). The production facility which receives the execution instruction executes the instructed automatic preparation operation (ST10: an automatic preparation operation step). That is, in the automatic preparation operation step (ST10), the determined automatic preparation operation is executed in each production facility.

When the automatic preparation operation is executed, updating unit 81f updates priority table 82f of the stored production facility based on the executed automatic preparation operation (ST11: an updating step). Updating unit 81f updates priority table 82f based on the acquired production history. Therefore, the priority of the automatic preparation operation can be determined in consideration of the state of the production facility such as the occurrence frequency of the recognition error and the suction error. In the production facility in which the instructed automatic preparation operation is executed (ST10) and priority table 82f is updated (ST11), the procedure returns to the board carrying in determination step (ST2) and carrying-in of next board B is determined.

In FIG. 10, in a case where there is no automatic preparation operation capable of executing in the production facility (No in step ST8), preparation operation instruction unit 81e instructs the production facility to wait until next board B is carried in (ST12; a waiting instruction step). In the production facility which receives the waiting instruction, the process returns to the board carrying in determination step (ST2) and the production facility waits until next board B is carried in (Yes in step ST2) or the automatic preparation operation is instructed (Yes in step ST8).

As described above, in the production method in component mounting system 1, in the production facility to which board B (workpiece) is transported (Yes in step ST2), the working step (ST3) is executed and in the production facility in which the automatic preparation operation is capable of executing in the gap time (Yes in step ST8), the automatic preparation operation step (ST10) is executed. Therefore, the production accuracy can be maintained without lowering the productivity of component mounting line 6.

As described above, component mounting system 1 of the embodiment of this disclosure includes component mounting line 6 (production line) for producing the mounting board (product) by connecting the plurality of the production facilities having the working units which do work on transported board B (workpiece); gap time calculator 81c that calculates the plurality of the gap times repeatedly corresponding to the plurality of the production facilities until the next workpiece is transported from the upstream production facility to each of the plurality of the production facilities based on the production status of each of the plurality of the production facilities; and preparation operation determination unit 81d that determines the automatic preparation operation capable of executing in each of the plurality of the production facilities based on the plurality of the gap times. Each of the plurality of the production facilities is the production system which executes the determined automatic preparation operation.

In addition, component mounting system 1 of the embodiment of this disclosure includes component mounting line 6 (production line); gap time calculator 81c that calculates the gap time until the next workpiece is transmitted to the production facility of the target from at least one production facility based on the production status of at least one production facility (for example, board supply apparatus 2, printing machine 3, and component mounting machines M1 to M6) on the upstream side from the production facility (for example, seventh component mounting machine M7) of the target in the plurality of the production facilities; and preparation operation determination unit 81d that determines the automatic preparation operation capable of executing in the production facility of the target based on the gap time. The production facility of the target executes the determined automatic preparation operation.

Production status acquisition unit 81a that acquires the production status of each of the plurality of the production facilities; gap time calculator 81c; preparation operation determination unit 81d; and preparation operation instruction unit 81e that instructs each of the production facilities the executable automatic preparation operation are provided. Management computer 8 that manages component mounting line 6 (production line) is the production line management apparatus. The production system and the production line management apparatus can maintain the production accuracy without lowering the productivity by causing the production facility to execute the automatic preparation operation capable of executing in the gap time.

Moreover, in the embodiment described above, an example in which management computer 8 includes preparation operation determination unit 81d is described, but the production facility such as component mounting machines M1 to M9 may be configured to include preparation operation determination unit 81d, the storage that stores priority table 82f, and updating unit 81f that updates priority table 82f. In this case, in each production facility, the executable automatic preparation operation is determined based on the gap time transmitted from management computer 8 by preparation operation determination unit 81d and the priority included in priority table 82f stored by the production facility, and priority table 82f is updated based on the automatic preparation operation executed by updating unit 81f.

Moreover, in the embodiment described above, management computer 8 acquires the production status from each apparatus of component mounting line 6, but may acquire the production status from a production plan. In a case where the production status is acquired from the production plan, gap time calculator 81c calculates a time during which the production is stopped, such as a break time and a production preparation time as a gap time on the production plan. In addition, in a case where the production status is in "stop", a predetermined time until the stop of the production work is canceled is preset, and gap time calculator 81c may calculate the predetermined time as the gap time. In addition, a plurality of different times may be provided for the predetermined time depending on a stopping cause, or the predetermined time may be set by a time until a stop of past production work is canceled, a test, or the like.

In addition, in a case where the production status is in "stop", "waiting for carrying in" or "waiting for carrying out" occurs in the upstream or downstream production facility of the production facility of which the production status is in "stop" until the stop of the production work is canceled. Therefore, gap time calculator 81c may calculate the gap time taking into consideration a predetermined time until the stop of the production work is canceled, "waiting for carrying in", or "waiting for carrying out".

The production system, the production method, and the production line management apparatus of this disclosure have an effect that the production accuracy can be maintained without lowering the productivity and are useful in the field of mounting the component on the board.

What is claimed is:

1. A production system comprising:
   a production line for producing a product by connecting a plurality of production facilities having working units for doing work on a transported workpiece;
   a gap time calculator that calculates a plurality of gap times respectively corresponding to the plurality of the production facilities until a next workpiece is transported from an upstream production facility to each of the plurality of the production facilities based on a production status of each of the plurality of the production facilities; and
   a preparation operation determination unit that determines an automatic preparation operation capable of being executed in each of the plurality of the production facilities based on the plurality of the gap times;
   a storage that stores a priority table of each of the plurality of the production facilities including a priority of the automatic preparation operation and a processing time of the automatic preparation operation,
   wherein the preparation operation determination unit is configured to compare the plurality of gap times with the processing time of the automatic preparation operation and select the automatic preparation operation based on both the priority included in the priority table and the processing time, such that the selected automatic preparation operation may not be the automatic preparation operation with the highest priority, and
   wherein each of the plurality of the production facilities executes the determined automatic preparation operation.

2. The production system of claim 1, further comprising:
   an updating unit that updates the priority table of each of the plurality of the production facilities based on the automatic preparation operation executed in each of the plurality of the production facilities.

3. The production system of claim 2,
   wherein the updating unit updates the priority table based on a production history of each of the plurality of the production facilities.

4. The production system of claim 1,
   wherein the workpiece is a board,
   wherein the product is a mounting board in which a component is mounted on the board via a solder, and
   wherein the production line includes at least one of a printing machine for applying the solder to the board, a component mounting machine for placing the component on the board to which the solder is applied, and a reflow apparatus for heating the board on which the component is placed and solidifying the solder as the plurality of the production facilities.

5. The production system of claim 1, wherein a second automatic preparation operation is selected based on having a processing time that falls within a remaining gap time although the second automatic preparation operation is not listed in the priority table as the next priority.

6. A production method in a production system including a production line for producing a product by connecting a plurality of production facilities having working units for doing work on a transported workpiece, the method comprising:
   a working step of doing work on the transported workpiece in each of the plurality of the production facilities;
   a production status acquisition step of acquiring a production status of each of the plurality of the production facilities;
   a gap time calculation step of calculating a plurality of gap times respectively corresponding to the plurality of the production facilities until a next workpiece is transported from an upstream production facility to each of the plurality of the production facilities based on the production status of each of the plurality of the production facilities;
   a preparation operation determination step of determining an automatic preparation operation capable of being executed in each of the plurality of the production facilities based on the plurality of the gap times; and
   an automatic preparation operation step of executing the determined automatic preparation operation in each of the plurality of the production facilities,
   a storage step of storing a priority table of each of the plurality of the production facilities including a priority of the automatic preparation operation and storing a processing time of the automatic preparation operation,
   wherein in the preparation operation determination step, the automatic preparation operation is determined based on both the priority included in the priority table and the processing time of the automatic preparation operation, such that the selected automatic preparation operation is not the automatic preparation operation with the highest priority, and
   wherein the working step is executed in a production facility of the plurality of the production facilities, to which a workpiece is transported, and the automatic preparation operation step is executed in a production facility of the plurality of the production facilities, in which the automatic preparation operation is capable of being executed.

7. The production method of claim 6, further comprising:
   an updating step of updating the priority table of each of the plurality of the production facilities based on the automatic preparation operation executed in each of the plurality of the production facilities.

8. The production method of claim 7, further comprising:
   a production history acquisition step of acquiring a production history of each of the plurality of the production facilities,
   wherein in the updating step, the priority table is updated based on the production history of each of the plurality of the production facilities.

9. The production method of claim 6,
   wherein the workpiece is a board,
   wherein the product is a mounting board in which a component is mounted on the board via a solder, and
   wherein the production line includes at least one of a printing machine for applying the solder to the board, a component mounting machine for placing the component on the board to which the solder is applied, and a reflow apparatus for heating the board on which the component is placed and solidifying the solder as the plurality of the production facilities.

10. The production method of claim 6, further comprising:
    calculating a remaining gap time by subtracting the processing time of the selected automatic preparation operation from the gap time of the production facility; and selecting a second automatic preparation operation in accordance with the remaining gap time although the second automatic preparation operation is not listed in the priority table as the next priority.

11. A production line management apparatus that manages a production line for producing a product by connecting a plurality of the production facilities having working units for doing work on a transported workpiece, the apparatus comprising:

a production status acquiring unit that acquires a production status of each of the plurality of the production facilities;

a gap time calculator that calculates a plurality of gap times respectively corresponding to the plurality of the production facilities until a next workpiece is transported from an upstream production facility to each of the plurality of the production facilities based on the production status of each of the plurality of the production facilities;

a preparation operation determination unit that determines an automatic preparation operation capable of being executed in each of the plurality of the production facilities based on the plurality of the gap times;

a storage that stores a priority table of each of the plurality of the production facilities including a priority of the automatic preparation operation and a processing time of the automatic preparation operation, wherein the preparation operation determination unit is configured to compare the plurality of gap times with the processing time of the automatic preparation operation and determine the automatic preparation operation based on both the priority included in the priority table and the processing time of the automatic preparation operation, such that the selected automatic preparation operation may not be the automatic preparation operation with the highest priority; and a preparation operation instructing unit that instructs the executable automatic preparation operation to each of the plurality of the production facilities.

12. The production line management apparatus of claim 11, further comprising:

an updating unit that updates the priority table of each of the plurality of the production facilities based on an instruction content of the preparation operation instructing unit.

13. The production line management apparatus of claim 12, further comprising:

a production history acquiring unit that acquires a production history of each of the plurality of the production facilities, wherein the updating unit updates the priority table based on the production history of each of the plurality of the production facilities.

14. The production line management apparatus of claim 11, wherein the workpiece is a board, wherein the product is a mounting board in which a component is mounted on the board via a solder, and wherein the production line includes at least one of a printing machine for applying the solder to the board, a component mounting machine for placing the component on the board to which the solder is applied, and a reflow apparatus for heating the board on which the component is placed and solidifying the solder as the plurality of the production facilities.

15. The production line management apparatus of claim 11, wherein a second automatic preparation operation is selected based on having a processing time that falls within a remaining gap time although the second automatic preparation operation is not listed in the priority table as the next priority.

* * * * *